(12) United States Patent
Li et al.

(10) Patent No.: US 10,373,797 B2
(45) Date of Patent: Aug. 6, 2019

(54) CHARGED PARTICLE BEAM DEVICE AND IMAGE FORMING METHOD USING SAME

(71) Applicant: Hitachi High-Technologies Corporation, Tokyo (JP)

(72) Inventors: Wen Li, Tokyo (JP); Kazuki Ikeda, Tokyo (JP); Hajime Kawano, Tokyo (JP); Hiroyuki Takahashi, Tokyo (JP); Makoto Suzuki, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 64 days.

(21) Appl. No.: 15/556,926

(22) PCT Filed: Feb. 16, 2016

(86) PCT No.: PCT/JP2016/054368
§ 371 (c)(1),
(2) Date: Sep. 8, 2017

(87) PCT Pub. No.: WO2016/143467
PCT Pub. Date: Sep. 15, 2016

(65) Prior Publication Data
US 2018/0247790 A1    Aug. 30, 2018

(30) Foreign Application Priority Data
Mar. 11, 2015   (JP) .................. 2015-048460

(51) Int. Cl.
*H01J 37/22*   (2006.01)
*H01J 37/244*   (2006.01)
*H01J 37/28*   (2006.01)

(52) U.S. Cl.
CPC .......... *H01J 37/222* (2013.01); *H01J 37/244* (2013.01); *H01J 37/28* (2013.01);
(Continued)

(58) Field of Classification Search
CPC .. H01J 37/00; H01J 37/02; H01J 37/22; H01J 37/222; H01J 37/24; H01J 37/244; H01J 37/26; H01J 37/261
(Continued)

(56) References Cited

U.S. PATENT DOCUMENTS

| 4,039,829 A  * | 8/1977 | Kato ...................... G01B 15/00 |
| | | 250/306 |
| 2008/0283744 A1* | 11/2008 | Takada .................... H01J 37/12 |
| | | 250/307 |
| 2014/0175279 A1* | 6/2014 | Agemura .............. H01J 37/244 |
| | | 250/310 |

FOREIGN PATENT DOCUMENTS

| JP | 4-322047 A | 11/1992 |
| JP | 8-162061 A | 6/1996 |
| JP | 2001-175811 A | 9/2011 |

OTHER PUBLICATIONS

International Search Report dated Mar. 29, 2016 for related PCT Application No. PCT/JP2016/054368.

* cited by examiner

*Primary Examiner* — Jason L McCormack
(74) *Attorney, Agent, or Firm* — Miles & Stockbridge PC

(57) ABSTRACT

In order to improve visibility of a measurement/inspection image in an inspection measurement apparatus inspecting or measuring a fine pattern, a charged particle beam device is configured to include a charged particle optical system that irradiates a surface of a sample with a converged charged particle beam so as to perform scanning, a detection unit that detects secondary charged particles generated from the sample irradiated with the charged particle beam by the charged particle optical system, an image forming unit that receives a detection signal from the detection unit and forms an image of the sample, an image processing unit that
(Continued)

processes the image formed in the image forming unit, and a display unit that displays a result processed by the image processing unit, in which the image forming unit includes an analog signal processing portion that processes an analog signal component of the detection signal in the detection unit so as to form an image, a pulse count method signal processing portion that processes a pulse signal component of the detection signal in the detection unit so as to form an image, and an image combination processing portion that combines the image formed in the analog signal processing portion with the image formed in the pulse count method signal processing portion.

12 Claims, 5 Drawing Sheets

(52) U.S. Cl.
CPC ... *H01J 2237/221* (2013.01); *H01J 2237/226* (2013.01); *H01J 2237/2448* (2013.01); *H01J 2237/24495* (2013.01)

(58) Field of Classification Search
USPC .......................................... 250/306, 307, 311
See application file for complete search history.

[Fig. 1]
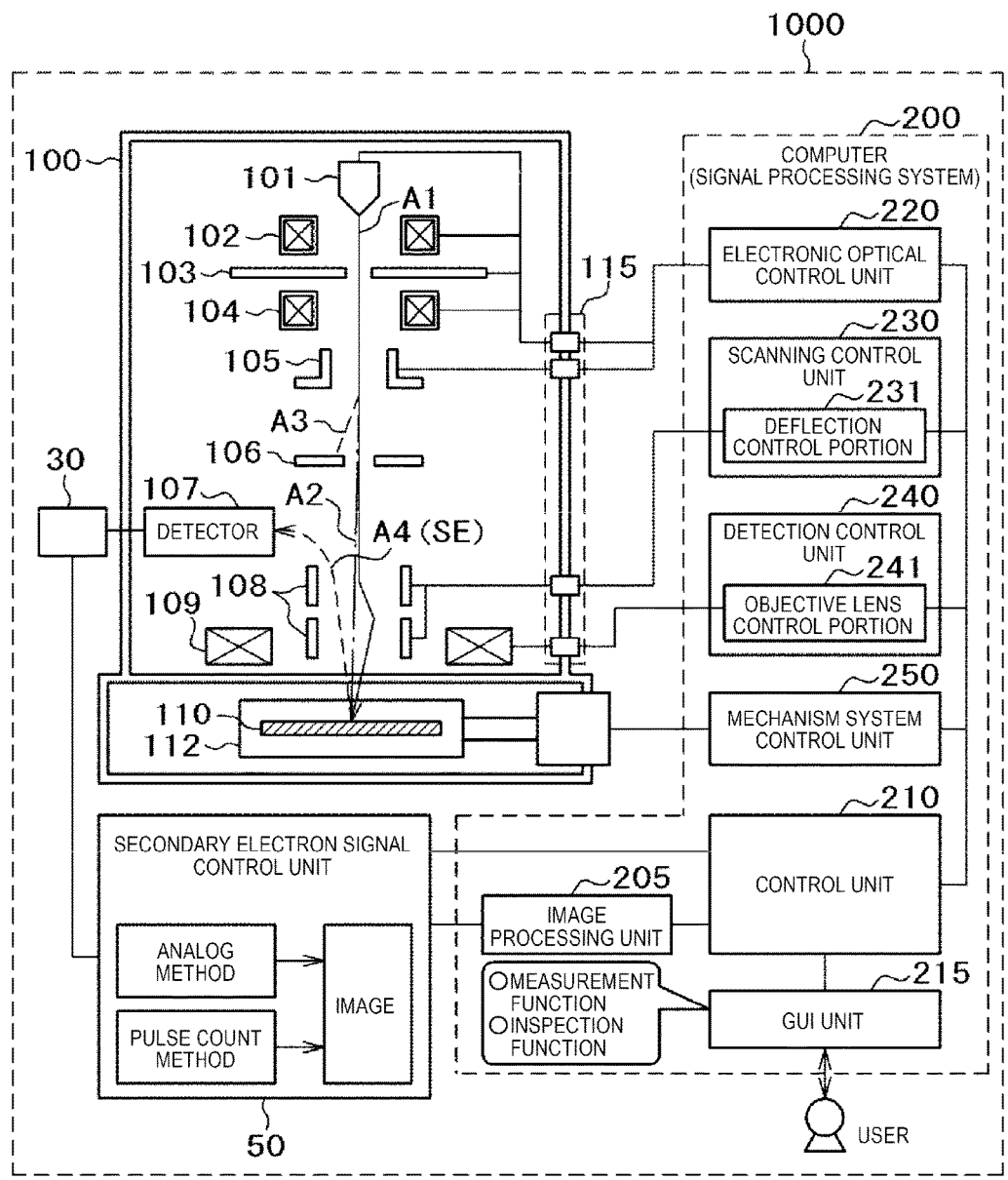

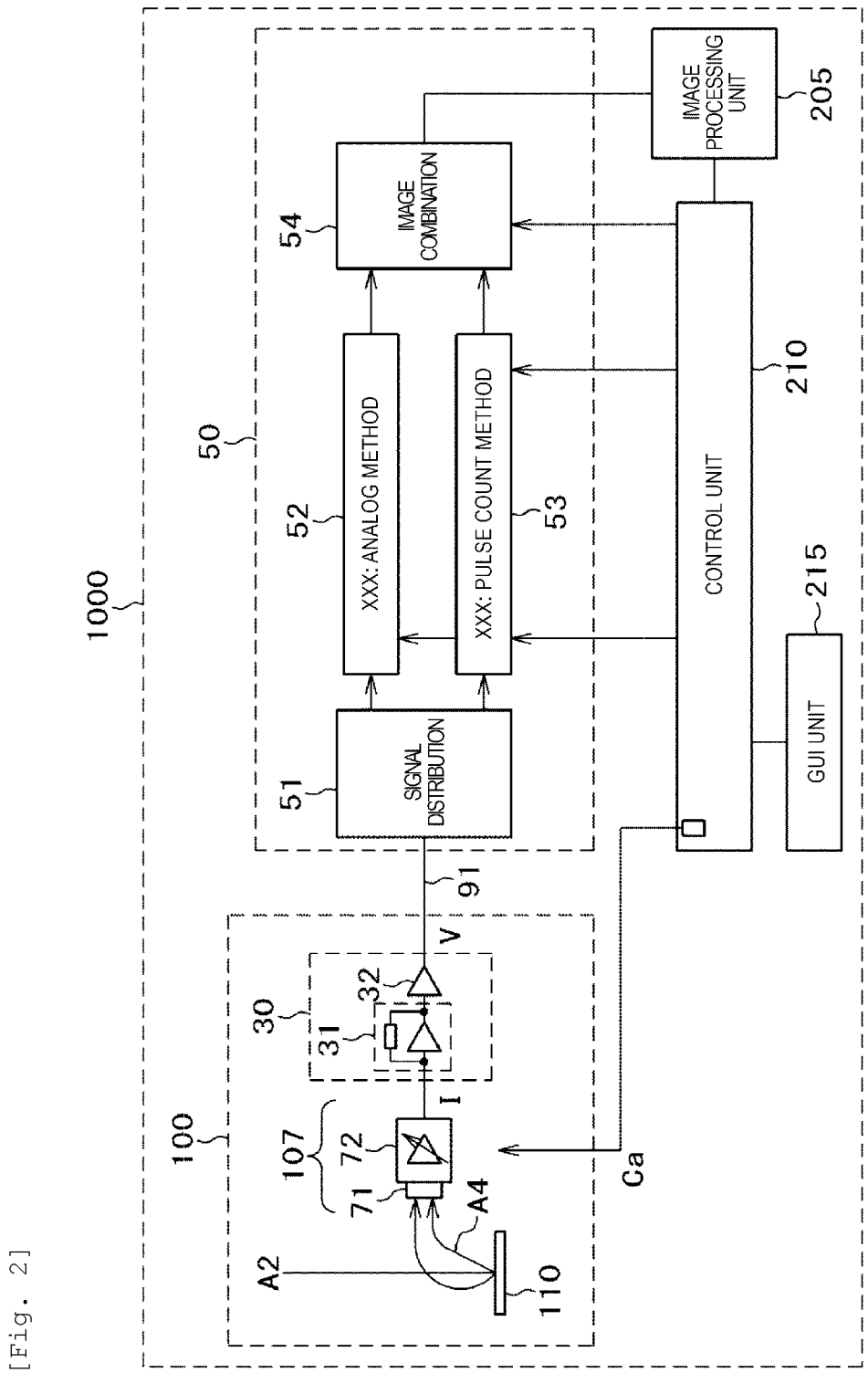
[Fig. 2]

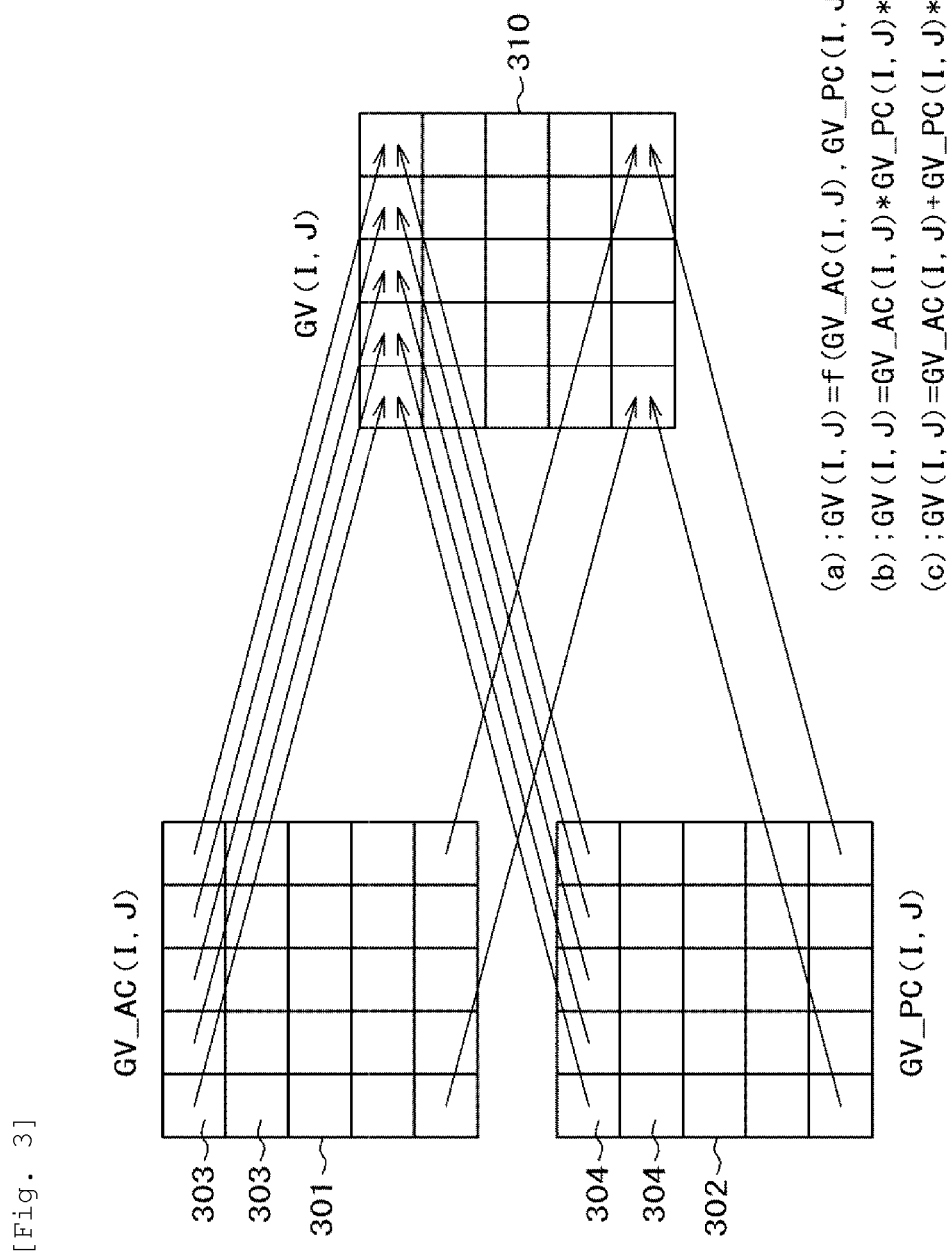

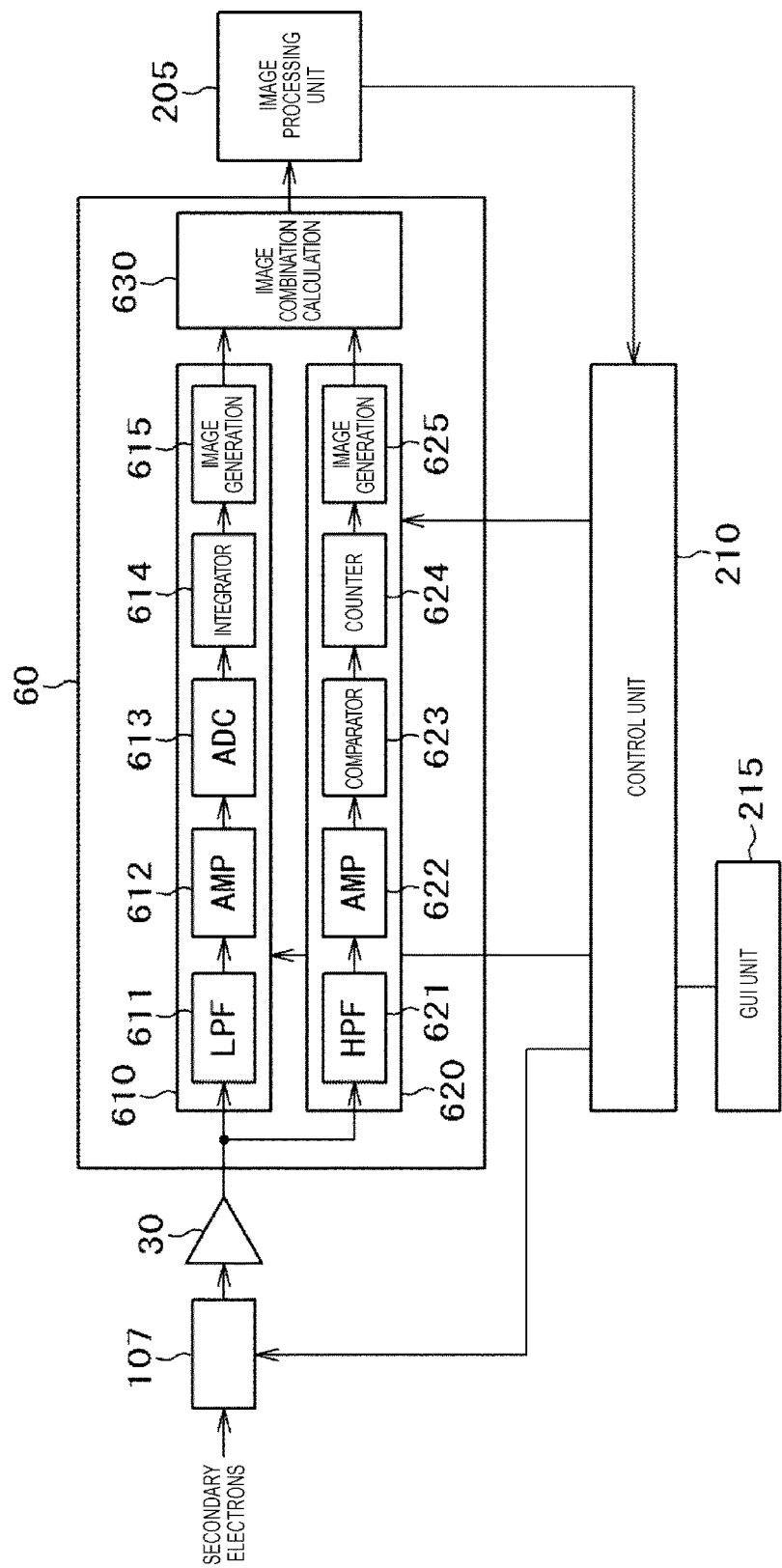
[Fig. 4]

[Fig. 5]
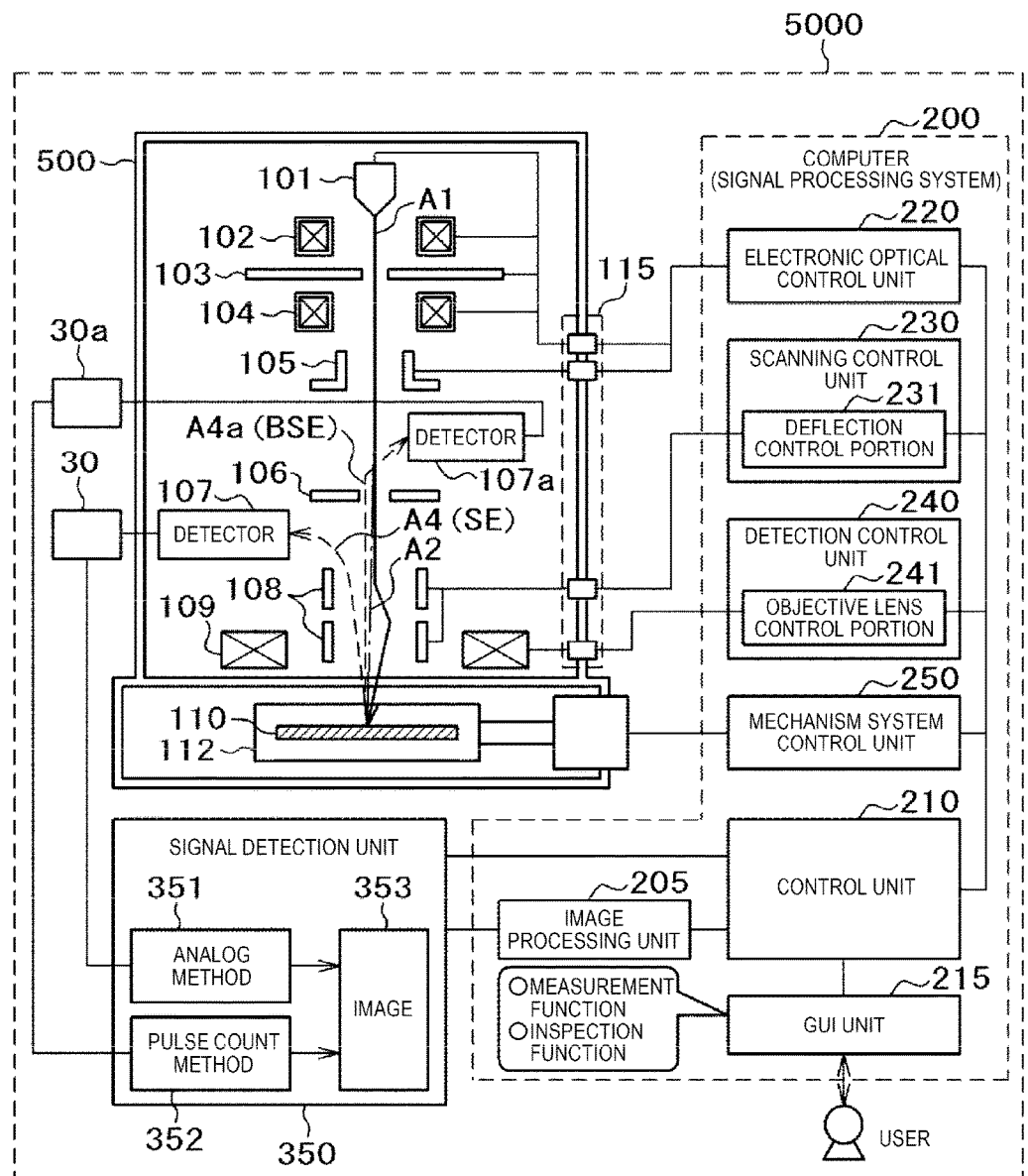

CHARGED PARTICLE BEAM DEVICE AND IMAGE FORMING METHOD USING SAME

TECHNICAL FIELD

The present invention relates to a charged particle beam device for measuring, observing, or inspecting a fine pattern formed on a sample, and an image forming method using the charged particle beam device.

BACKGROUND ART

In a charged particle beam measurement apparatus typified by a scanning electron microscope, a combination of a scintillator and a photomultiplier tube is used to detect secondary electrons or reflected electrons generated when a sample is irradiated with an electron beam. If light emitted from the scintillator is incident to the photomultiplier tube, photoelectrons are emitted from a photoelectric surface, and the electrons are amplified in the photomultiplier tube. Here, since a pulse interval of a photomultiplier tube output is small in a region where incident light is strong, pulses overlap each other so as to form an analog waveform. However, if light is weakened, respective pulses are discrete, and thus a pulsed output waveform is formed.

As an example of the related art regarding a method of detecting such an analog waveform and a pulsed output waveform, there is a technique disclosed in JP-A-2011-175811 (PTL 1). PTL 1 discloses the following content. A charged particle beam device includes a determination unit that determines whether an output signal is an output signal in a state in which a single charged particle is incident to a detector or is an output signal in a state in which a plurality of charged particles are incident to the detector; and a calculation unit which performs image formation through signal processing based on a pulse count method when determining that the output signal is an output signal in a state in which a single charged particle is incident to the detector and performing the image formation through signal processing based on an analog method when determining that the output signal is an output signal in a state in which the plurality of charged particles are incident to the detector.

CITATION LIST

Patent Literature

PTL 1: JP-A-2011-175811

SUMMARY OF INVENTION

Technical Problem

In a semiconductor manufacturing process, micronization of a circuit pattern formed on a semiconductor substrate (wafer) has rapidly progressed, and thus importance of process monitoring for monitoring whether or not such a pattern is formed as designed has further increased. For example, in order to detect the occurrence of an abnormality or a defect earlier or in advance in a semiconductor manufacturing process, a circuit pattern or the like on a wafer is measured and inspected when each manufacturing step is completed.

In a measurement inspection apparatus such as an electron microscope apparatus (SEM) using a scanning electron beam type, and a measurement inspection method corresponding thereto during the measurement, observation, or inspection, a target wafer (sample) is scanned and irradiated with an electron beam, and energy or secondary or reflected electrons generated due to scanning and irradiation is detected. An image (a measurement image or an inspection image) is generated through signal processing, image processing, or the like on the basis of the detection, and measurement, observation, or inspection is performed on the basis of the image.

For example, in a case of an apparatus (an inspection apparatus, an inspection function) inspecting a defect in a circuit pattern, images of the same circuit pattern are compared with each other by using inspection images, and a location where a difference therebetween is great is determined and detected as a defect.

In a case of an apparatus (a measurement apparatus, a measurement function) performing measurement in a circuit pattern, an amount of generated secondary electrons or reflected electrons changes depending on unevenness (surface shape) of a sample, and thus a change or the like in the surface shape of the sample can be understood through a process of evaluating a signal based on the secondary electrons. Particularly, by using the fact that a level of a signal based on secondary electrons rapidly increases at an edge part of a circuit pattern, an edge position of the circuit pattern in an image is estimated, and thus a dimension value of the circuit pattern can be measured. It is possible to evaluate the quality of processing of the circuit pattern on the basis of the measurement result.

In a case of an apparatus (review apparatus) for observing a defect detected by another inspection apparatus in detail, a defect position is detected from a secondary electron image at a low magnification on the basis of a position coordinate of the defect detected by another inspection apparatus, an enlarged image of the defect is captured in a secondary electron image at a high magnification, the defect is observed by using the enlarged image, and a feature amount of the defect on the image is extracted from the enlarged image so that the defect is classified.

Hereinafter, a description will be made of an electron beam scanning method in a measurement inspection apparatus such as an SEM in the example of the related art. For example, typical scanning with an electron beam in a CD-SEM (length measurement SEM) will be referred to as TV scanning or raster scanning. When TV scanning is used as a reference, scanning in which scanning speed is n times the reference speed will be referred to as n-times speed scanning or the like.

In a raster scanning method or a TV scanning method of the related art, there is a problem in that a sample charge amount differs depending on a scanning direction or a scanning speed of an electron beam, or a shape of a pattern formed on a sample. This becomes more remarkable due to micronization of a measurement or inspection target pattern. In an image obtained by scanning a fine pattern as a measurement or inspection target with an electron beam and detecting secondary electrons, there is a problem in that image contrast is reduced, or an edge of a circuit pattern is lost due to the difference in a sample charge amount, and thus the accuracy of observation, that is, measurement or inspection of a sample surface state is reduced, or measurement or inspection cannot be performed.

Regarding the reduction in the accuracy of measurement or inspection, electron beam irradiation time per unit region is reduced, that is, an irradiation charge density is reduced, and thus it is effective that a sample charge amount is reduced or is made appropriate. For this, it is effective to increase an electron beam irradiation scanning speed to n times, that is, to realize fast scanning. However, there is a problem in that an irradiation charge density is reduced due to fast scanning with the electron beam, and thus a frequency of generation of secondary electrons or reflected electrons generated from the sample is reduced, that is, a frequency of detection of the secondary electrons or the like is reduced.

As a method of detecting secondary electrons or reflected electrons, there are an analog detection method and a pulse count method.

The analog detection method is a method of generating signal intensity of secondary electrons as an image by using an integral value in the pixel unit. As the method, a method is considered to be appropriate in which an output value is periodically read from a signal waveform, and each peak value is used as pixel data. Typically, an output value is read through sampling using an analog/digital converter (hereinafter, referred to as an ADC). Amplitude information of a sampled signal is integrated and averaged with a pixel so that a grayscale value difference of the pixel is generated, and thus brightness change information of an image can be obtained. However, in a case where a fine pattern is scanned with an electron beam at a high speed, a frequency of generation of secondary electrons from a sample is reduced, and thus a discrete pulse signal with a narrow width is output from a detection system. However, this pulse signal leaks to background noise of the detection system, and thus there is a problem in that a signal-to-noise ratio (S/N ratio) of a detection signal is low.

On the other hand, the pulse count method is a method in which peak detection is performed on a discrete pulse signal output from a secondary electron detection system in a case where a fine pattern is scanned with an electron beam at a high speed, and the number of pulse signals exceeding a certain threshold value is counted. With respect to a reduction in a generation frequency of secondary electrons or the like generated in a case where a fine pattern is scanned with an electron beam at a high speed, the pulse count method is effective for detection of secondary electrons generated at a low frequency since a signal can be detected at a higher signal-to-noise ratio (S/N ratio) than in the analog detection method. However, in the pulse count method, a signal output has only information regarding the presence or absence of a pulse, and only a black-and-white binary image can be obtained. A large number of integrated frames is necessary in order to generate a grayscale value indicating brightness change information of an image at a pulse frequency of each pixel.

Therefore, an object of the present invention is to provide a charged particle beam device improving visibility of a measurement/inspection image in an inspection measurement apparatus inspecting or measuring a fine pattern, and an image forming method using the charged particle beam device.

Solution to Problem

In order to solve the problem, according to the present invention, there is provided a charged particle beam device including a charged particle optical system that irradiates a surface of a sample with a converged charged particle beam so as to perform scanning; a detection unit that detects secondary charged particles generated from the sample irradiated with the charged particle beam by the charged particle optical system; an image forming unit that receives a detection signal from the detection unit and forms an image of the sample; an image processing unit that processes the image formed in the image forming unit; and a display unit that displays a result processed by the image processing unit, in which the image forming unit includes an analog signal processing portion that processes an analog signal component of the detection signal in the detection unit so as to form an image, a pulse count method signal processing portion that processes a pulse signal component of the detection signal in the detection unit so as to form an image, and an image combination processing portion that combines the image formed in the analog signal processing portion with the image formed in the pulse count method signal processing portion.

In order to solve the problem, according to the present invention, there is provided a charged particle beam device including a charged particle optical system that irradiates a surface of a sample with a converged charged particle beam so as to perform scanning; a detection unit that detects secondary charged particles generated from the sample irradiated with the charged particle beam by the charged particle optical system; an image forming unit that receives a detection signal from the detection unit and forms an image of the sample; an image processing unit that processes the image formed in the image forming unit; and a display unit that displays a result processed by the image processing unit, in which the image forming unit includes a signal distribution portion that separates the detection signal in the detection unit into a low frequency component and a high frequency component, and outputs the separated low frequency signal component and high frequency signal component, a low frequency signal processing portion that processes the low frequency signal component output from the signal distribution portion so as to form an image, a high frequency signal processing portion that processes the high frequency signal component output from the signal distribution portion so as to form an image, and an image combination processing portion that combines the image formed in the low frequency signal processing portion with the image formed in the high frequency signal processing portion.

In order to solve the problem, according to the present invention, there is provided an image forming method using a charged particle beam device, the method including causing an electronic optical system to irradiate a surface of a sample with a converged charged particle beam so as to perform scanning; causing a detection unit to detect secondary charged particles generated from the sample irradiated with the charged particle beam by the electronic optical system; causing an image forming unit to receive a detection signal from the detection unit having detected the secondary charged particles and to form an image of the sample; causing an image processing unit to process the image formed in the image forming unit; and causing a display unit to display a result processed by the image processing unit, in which forming an image of the sample in the image forming unit includes causing an analog signal processing portion to process an analog signal component of the detection signal in the detection unit so as to form an image, causing a pulse count method signal processing portion to process a pulse signal component of the detection signal in the detection unit so as to form an image, and causing an image combination processing portion to combine the image formed in the analog signal processing portion with the image formed in the pulse count method signal processing portion.

Advantageous Effects of Invention

According to the representative aspect, the charged particle beam measurement/inspection apparatus is configured to generate an image by using both of an analog integration method and a pulse count method, and thus it is possible to perform high sensitivity detection of a weak secondary electron due to a high resolution and fast scanning and to make luminance grayscales of a detection image appropriate, and thus to contribute to improvement of a resolution and achievement of high throughput.

BRIEF DESCRIPTION OF DRAWINGS

FIG. 1 is a block diagram illustrating a schematic configuration of a measurement observation inspection apparatus using a scanning electron microscope related to Example 1 of the present invention.

FIG. 2 is a block diagram illustrating a configuration of a secondary electron detection signal processing unit of the measurement observation inspection apparatus using the scanning electron microscope related to Example 1 of the present invention.

FIG. 3 is a diagram of images illustrating a method of combining an image formed by an analog signal processing portion with an image formed by a pulse counting method signal processing portion in the measurement observation inspection apparatus using the scanning electron microscope related to Example 1 of the present invention.

FIG. 4 is a block diagram illustrating a configuration of a secondary electron detection signal processing unit of a measurement observation inspection apparatus using a scanning electron microscope related to Example 2 of the present invention.

FIG. 5 is a block diagram illustrating a schematic configuration of a measurement observation inspection apparatus using a scanning electron microscope related to Example 3 of the present invention.

DESCRIPTION OF EMBODIMENTS

According to the present invention, a charged particle image signal for a sample acquired by using a scanning electron microscope is divided into a high frequency component and a low frequency component, images are formed by using the respective signal components, and an image in which a boundary region of a pattern formed on the sample is clear is obtained by combining the formed images with each other.

Hereinafter, with reference to the drawings, an embodiment of the present invention will be described in detail. The same reference numerals are given to the same portions throughout all the drawings for explaining the embodiment, and repeated description thereof will be omitted. In the following description, a measurement inspection apparatus and a measurement inspection method include a case where only measurement is performed, a case where only inspection is performed, and a case where both of measurement and inspection are possible.

Example 1

With reference to FIGS. 1, 2 and 3, a description will be made of a scanning electron beam type measurement inspection apparatus and a measurement inspection method using the measurement inspection apparatus in Example 1 of the present invention, through comparison with an example of the related art.

[Measurement Inspection Apparatus]

FIG. 1 illustrates a configuration of the entire system including a measurement/inspection apparatus of Example 1. A measurement/inspection apparatus 1000 of Example 1 is an application example to a scanning electron beam type electron microscope apparatus (SEM) having a function of performing automatic measurement and inspection with a semiconductor wafer as a sample 110. The measurement/inspection apparatus 1000 has a measurement function of measuring a dimension value of a pattern on a surface of the sample 110, and a detection function of detecting a state such as an abnormality or a defect in the pattern.

The measurement/inspection apparatus 1000 is configured to include a column 100 which is a main body, a mechanism system including a sample stage 112 which is a stage on which the sample 110 or the like is mounted, a computer 200 which is a signal processing system, a secondary electron detection signal processing unit 50, and the like. The column 100 has an SEM type electronic optical system, a detector 107, or the like built thereinto. The detector 107 of the column 100 is connected to the secondary electron detection signal processing unit 50 via a preamplifier circuit 30, and the secondary electron detection signal processing unit 50 is connected to the computer 200. The preamplifier circuit 30 or the secondary electron detection signal processing unit 50 is formed of, for example, an electronic circuit board. For example, a board such as the preamplifier circuit 30 may be connected to the side surface vicinity (inside or outside) of the column 100.

The computer 200 may be implemented by, for example, a PC. The computer 200, the secondary electron detection signal processing unit 50, and the like are stored in, for example, a control rack. The column 100, the electronic circuit board, the computer 200, and the like are connected to each other via a cable or the like. There may be an aspect in which the computer 200 is integrated with other boards (30, 50).

The computer 200 includes an image processing unit 205, a control unit 210, a graphical user interface (GUI) unit 215, an electronic optical control unit 220, a scanning control unit 230, a detection control unit 240, a mechanism system control unit 250, and the like. For example, the units are realized through software program processing using well-known elements such as a processor and a memory, or dedicated circuit processing. The computer 200, the control unit 210, and the like have both of the measurement function and the detection function, but may have only one of the two functions.

The control unit 210 performs a process of controlling the whole and each unit of the measurement/inspection apparatus 1000, and a measurement/inspection process in response to an instruction which is input from a user via a GUI screen displayed by the GUI unit 215. During measurement/inspection, the control unit 210 acquires data information including a detected and generated image via the secondary electron detection signal processing unit 50 and the image processing unit 205, and causes the GUI unit 250 to display the data information on a GUI screen. The control unit 210 stores the data information including an image, measurement/inspection setting information, or the like in storage means such as a memory or a storage, and manages the information.

The GUI unit 215 performs a process of providing a GUI screen to a user performing measurement/inspection. The user can selectively execute the measurement function or the inspection function with respect to measurement/inspection work on a GUI screen, and can give various operation instructions or can view data information. The GUI unit 215 provides a screen for inputting/setting measurement/inspection conditions, a screen on which measurement/inspection results are displayed in a format such as a two-dimensional image, or the like. The GUI unit 215 includes input and output devices such as a keyboard, a mouse, and a display, a communication interface, and the like. The measurement function or the detection function may be selectively executed.

The electronic optical control unit 220 is configured to include a blanking control circuit or the like, and drives an optical system including an electron gun 101, lenses (102, 104), a diaphragm 103, blanking control electrodes 105, and the like in the column 100 so as to control irradiation with electron beams (A1, A2, A3) under the control of the control unit 210. An electronic optical system including an optical lens and the like in the column 100 is controlled.

The scanning control unit 230 is configured to include a deflection control circuit 231, and drives portions including a deflector 108 in the column 100 under the control of the control unit 210, so as to perform scanning control by irradiating the sample 110 with the electron beam (A2). The scanning control unit 230 realizes a scanning control function corresponding to a scanning mode at each scanning speed which will be described later, and performs scanning control according to a designated scanning speed. The deflection control circuit 231 applies a deflection control signal to the deflector 108 so as to control scanning using deflection of an electron beam.

The detection control unit 240 is configured to include an objective lens control circuit 241 and the like, and drives portions including an objective lens 109 in the column 100 under the control of the control unit 210, so as to control the detector 107 to detect a secondary electron signal A4 (SE) from the sample 110. The objective lens control circuit 241 applies an objective lens control signal to the objective lens 109, so as to control detection of secondary electrons (SE) A4 generated when irradiating the sample 110 with the beam A2.

The mechanism system control unit 250 applies a control signal to a mechanism system such as the sample stage 112 so as to control an operation thereof under the control of the control unit 210. For example, movement of the sample stage 112 in X and Y directions is controlled so as to correspond to information regarding an observation position of the sample 110 mounted on the sample stage 112.

The reference numeral 115 indicates a driver circuit or a terminal thereof used when each control unit (220, 230, 240) performs driving control on a corresponding electrode or the like.

A vacuum exhaust pump (not illustrated) exhausts the inside of the column 100 so that the inside thereof can be made vacuum. Elements forming the electronic optical system disposed inside the column 100 include the electron gun 101, a first condenser lens 102, the diaphragm 103, a second condenser lens 104, the blanking control electrodes 105, an aperture 106, the deflector 108, and the objective lens 109. The detector 107 is provided in the column 100 as an element forming the detection system. As illustrated in FIG. 2, the detector 107 is configured to include a scintillator 71 and a photomultiplier tube 72.

The electron gun 101 emits the beam A1 which is a primary electron beam. The first condenser lens 102 is a condensing lens, and causes the beam A1 emitted from the electron gun 101 to pass therethrough. The second condenser lens 104 is a condensing lens, and causes the beam narrowed by the diaphragm 103 to pass therethrough. The beam A1 emitted from the electron gun 101 is focused through the first condenser lens 102, the diaphragm 103, and the second condenser lens 104.

The blanking control electrodes 105 are used to perform blanking control for controlling ON/OFF of stoppage of beam irradiation. Typically, during stoppage OFF, a beam passes between the blanking control electrode 105 without being changed, and passes through the aperture 106 as in the beam A2. During stoppage ON, a beam is bent between the blanking control electrode 105, and thus does not pass through the aperture 106 so as to be blocked as in the beam A3. The beam A2 passing through the aperture 106 is controlled to be deflected via the deflector 108. In other words, the beam A2 is subject to scanning control including deflection control, and the sample 110 on the sample stage 112 is scanned and irradiated with the beam A2 through the objective lens 109 or the like. Some of the secondary electrons A4 (SE) generated from the sample 110 due to irradiation of the sample 110 with the electron beam A2 are incident to the detector 107, and are detected as an electrical signal/analog signal (also referred to as a detection signal, a pulse signal, or the like).

The analog signal detected by the detector 107 to which the secondary electrons A4 are incident passes through a current (I)-voltage (V) conversion portion 31 of the preamplifier circuit 30 so as to be pre-amplified in an amplifier 32, and is then incident to the secondary electron detection signal detection unit 50. In the secondary electron detection signal detection unit 50, a signal is distributed to two paths by a signal distribution portion 51 which will be described later so that an analog image signal is obtained according to an analog method through an analog method signal detection portion 52, and a pulse image signal is obtained according to a pulse count method through a pulse count method signal detection portion 53, and the obtained signals are combined with each other for an image in the pixel unit in an image configuring portion 54. A finally combined image signal is input to the image processing unit 205.

In the image processing unit 205, image processing corresponding to measurement or inspection is performed by using a digital signal or sampling data output from the secondary electron detection signal processing unit 50, and thus a two-dimensional measurement image or inspection image is generated. In a case of the measurement function, the image processing unit 205 generates a measurement image, and computes a pattern dimension value in the image. In a case of the inspection function, an inspection image is generated, and a process of detecting/determining a defect or the like in the image is performed.

The control unit 210 acquires data information including the image, and stores and manages the data information in a memory of the computer 200. A GUI screen including the image and the data information is generated through the processes in the control unit 210 to the GUI unit 250, and is displayed to a user. For example, in a case of the measurement function, a dimension or the like of a circuit pattern is measured on the basis of information in a measurement image. In a case of the inspection function, an abnormality, a defect, or the like is detected on the basis of information in an inspection image.

Next, FIG. 2 illustrates details of the secondary electron detection signal processing unit 50. The secondary electron detection signal processing unit 50 includes the signal distributor 51, the analog method signal processing portion 52, the pulse count method signal processing portion 53, and the image combination processing portion 54, and receives and processes a detection signal in the detector 107, output from the preamplifier circuit 30 connected to the detector 107, and outputs a combined image generated as a result thereof to the image processing unit 205.

The signal distributor 51 receives the detection signal in the detector 107 which is amplified by and output from the preamplifier circuit 30, and distributes an analog component of the received detection signal to the analog method signal processing portion 52 and a pulse signal component to the pulse count method signal processing portion 53.

The analog method signal processing portion 52 which receives the analog signal component of the detection signal in the detector 107 from the signal distributor 51 converts the received analog signal into a digital signal so as to form a multi-grayscale (for example, 256 grayscales) digital image. When the digital image is formed, for example, in a case where the measurement/inspection apparatus 1000 is a CD-SEM (length measurement SEM), in order to improve contrast of an image, the same measurement region on a sample surface is repeatedly scanned a plurality of times with the electron beam A2 which is caused to converge by the objective lens 108, so that a plurality of frame images of the same region is obtained, and a single measurement image is generated by adding the plurality of frame images together.

In a case where a measurement pattern formed on the sample 110 is a fine pattern whose width is smaller than several 10 nm, and the fine pattern is imaged through fast scanning by increasing a scanning speed of the electron beam A2, it may be hard to obtain a clear image in which an edge part of the fine pattern can be specified even in a measurement image which is generated by adding a plurality of frame images together in the analog method signal processing portion 52. It is considerably hard to obtain an accurate dimension of the pattern from such an image, and, even if the dimension is obtained, a large error component is included therein.

The pulse count method signal processing portion 52 which receives the pulse signal component of the detection signal in the detector 107 from the signal distributor 51 extracts a pulse signal whose level is higher than a preset threshold level from the received pulse signals, and stores the pulse signal along with position information with a pulse count number at that position as 1. The position information is obtained on the basis of a deflection control signal from the deflection control portion 231 which controls the deflection electrodes 108 performing scanning with an electron beam.

In a case where the measurement/inspection apparatus 1000 is a CD-SEM (length measurement SEM), as described above, the same measurement region on a sample surface is repeatedly scanned a plurality of times with the converged electron beam A2, so that a plurality of frame images of the same region is obtained, and a single measurement image is generated by adding the plurality of frame images together. In other words, the number of pulses having levels higher than the threshold level is added by the number of frames at respective positions, and images corresponding to pulse count numbers at the respective positions are formed. In the detection signal in the detector 107 which is amplified in and output from the preamplifier circuit 30, the pulse signal component is detected relatively much from an edge part of the pattern. Therefore, images of the edge of the pattern are obtained as images which are added by the number of frames so as to be formed and correspond to pulse count numbers at respective positions.

As illustrated in FIG. 3, the image combining portion 54 combines a single measurement image 301 (a signal for each pixel 303 indicated by (I,J) of GVAC(I,J)) generated by adding a plurality of frame images in the analog method signal processing portion 52 with an image 302 (a signal for each pixel 304 indicated by (I,J) of GVPC(I,J)) of a pattern edge formed in the pulse count method signal processing portion 52, in the pixel unit or for each fine region with several pixel unit, so as to create a combined image GV(I,J). Therefore, it is possible to obtain an image 310 which is clearer in the edge part of the pattern than the single measurement image generated by adding a plurality of frame images in the analog method signal processing portion 52, and in which background noise is removed and image quality is improved.

There are several methods of obtaining the combined image GV(I,J). For example, the methods include a filtering method of calculating the measurement image 301: GVAC (I,J) and the edge image 302: GVPC(I,J) by using a certain relational expression as illustrated in (a) in FIG. 3, a method of multiplying the measurement image 301: GVAC (I,J) and the edge image 302: GVPC(I,J) by each other and multiplying a result thereof by a certain coefficient GK as illustrated in (b), and a method of adding a result of multiplying the edge image 302: GVPC (I,J) by a certain coefficient GK to the measurement image 301: GVAC(I,J) as illustrated in (c).

The image 310 combined in the image combining portion 54 is sent to the image processing unit 205. In a case where the measurement/inspection apparatus 1000 is a CD-SEM (length measurement SEM), the image processing unit 205 receiving the image 310 generates a measurement image on the basis of the received image 310, computes a pattern dimension value in the image, and outputs a result thereof from the GUI unit 215. In a case where the measurement/ inspection apparatus 1000 is an inspection apparatus, the image processing unit 205 receiving the image 310 generates an inspection image on the basis of the received image 310, compares a reference image with the image so as to detect a defect of the pattern in the image, and outputs a result thereof from the GUI unit 215.

As mentioned above, according to the present example, the charged particle beam measurement/inspection apparatus which generates an image by using both of an analog integration method of receiving an analog signal and forming an integration image and a pulse count method can perform high sensitivity detection of a weak secondary electron due to a high resolution and fast scanning and can make luminance grayscales of a detection image appropriate, and thus contributes to improvement of a resolution and achievement of high throughput.

Example 2

With reference to FIG. 4, Example 2 of the present invention will be described. In the present example, a configuration of a scanning electron beam type inspection/ measurement apparatus is the same as described in Example 1 with reference to FIG. 1 except for a secondary electron detection signal processing unit 60, and thus description thereof will be omitted.

FIG. 4 illustrates a configuration of the secondary electron detection signal processing unit 60 in the present example. The secondary electron detection signal processing unit 60 in the present example includes an analog method signal processing portion 610 and a pulse count method signal processing portion 620. A detection signal in the detector 107 which is amplified in and output from the preamplifier circuit 30 is simultaneously input to the analog method signal processing portion 610 and the pulse count method signal processing portion 620. The analog method signal processing portion 610 extracts an analog signal from the input signal, performs signal processing on the analog signal according to an analog method so as to form an image. The pulse count method signal processing portion 620 extracts a pulse signal component from the input signal, and performs signal processing on the pulse signal component according to a pulse count method so as to create an edge image.

The analog method signal processing portion 610 includes a low-pass filter (LPF) 611, an amplifier (AMP) 612, an analog-digital converter (ADC) 613, an integrator 614, and an image generation processor 615. In this configuration, a detection signal in the detector 107 which is amplified in and output from the preamplifier circuit 30 is input to the low-pass filter (LPF) 611 so that a high frequency component is cut off, and a low frequency component is sent to the amplifier (AMP) 612 so as to be amplified and to be then converted into a digital signal in the analog-digital converter (ADC) 613, and a result thereof is input to the integrator 614. In order to improve contrast of an image, the integrator 614 adds digital signals of a plurality of frames for the same region which are obtained by repeatedly scanning the same measurement region on a sample surface a plurality of times. After digital signals of a predetermined number of frames are added together in the integrator 614, the addition result signal is sent to the image generation processor 615 so that an image in which the signals of a plurality of frames are added together is formed.

On the other hand, the pulse count method signal processing portion 620 includes a high-pass filter (HPF) 621, an amplifier (AMP) 622, a comparator 623, a counter 624, and an image generation processor 625. In this configuration, a detection signal in the detector 107 which is amplified in and output from the preamplifier circuit 30 is input to the high-pass filter (HPF) 621 so that a low frequency component is cut off, and a high frequency component such as a pulse signal is sent to the amplifier (AMP) 622 so as to be amplified and to be then compared with a preset threshold value in the comparator 623, and a pulse signal having a value greater than the threshold value is sent to the counter 624. The counter 624 counts, for each pixel, pulse signals sent from the comparator 623 for a plurality of respective frames for the same region which are obtained by repeatedly scanning the same measurement region on a sample surface a plurality of times. After pulse signals of a predetermined number of frames are counted in the counter 624, the count information is sent to the image generation processor 625, and thus images corresponding to the number of pulses of a plurality of frames are formed.

As described in Example 1, an image (frame addition image) which is formed in the image generation processor 615 of the analog method signal processing portion 610 and in which signals of a plurality of frames are added together may be hardly obtained as a clear image in which an edge part of a pattern can be specified in a case where an imaging target pattern is fine. It is considerably hard to obtain an accurate dimension of the pattern from such an image, and, even if the dimension is obtained, a large error component is included therein. On the other hand, images of an edge of a pattern are obtained as images formed in the image generation processor 625 of the pulse count method signal processing portion 620 as described in Example 1.

An image combining portion 630 combines, as described with reference to FIG. 3 in Example 1, a measurement image generated by adding a plurality of frame images output from the image generation processor 615 of the analog method signal processing portion 610 with the images of the edge of the pattern formed in the pulse count method signal processing portion 620 in the pixel unit or for each fine region with several pixel unit. Consequently, it is possible to obtain an image which is clearer in the edge part of the pattern than the single measurement image generated by adding a plurality of frame images in the analog method signal processing portion 610, and in which background noise is removed and image quality is improved.

An image combination method in the image combining portion 630 is the same as described in Example 1 with reference to FIG. 3, and thus a description thereof will be omitted.

An image combined in the image combining portion 630 is sent to the image processing unit 205. In a case where the measurement/inspection apparatus 1000 is a CD-SEM (length measurement SEM), the image processing unit 205 receiving the combined image generates a measurement image on the basis of the received combined image, computes a pattern dimension value in the combined image, and outputs a result thereof from the GUI unit 215. In a case where the measurement/inspection apparatus 1000 is an inspection apparatus, the image processing unit 205 receiving the combined image generates an inspection image on the basis of the received combined image, compares a reference image with the image so as to detect a defect of the pattern in the image, and outputs a result thereof from the GUI unit 215.

As mentioned above, according to the present example, the charged particle beam measurement/inspection apparatus which generates an image by using both of an analog integration method of receiving an analog signal and forming an integration image and a pulse count method can perform high sensitivity detection of a weak secondary electron due to a high resolution and fast scanning and can make luminance grayscales of a detection image appropriate, and thus contributes to improvement of a resolution and achievement of high throughput.

Example 3

With reference to FIG. 5, Example 3 of the present invention will be described.

A difference between a measurement/inspection apparatus 5000 illustrated in FIG. 5 and the measurement/inspection apparatus 1000 of Example 1 illustrated in FIG. 1 is that the single detector 107 is provided inside the column 100 which is a main body in the measurement/inspection apparatus 1000 illustrated in FIG. 1 in Example 1, whereas not only the detector 107 but also a detector 107a is provided in a column 500 which is a main body of the measurement/inspection apparatus 5000 in the present example illustrated in FIG. 5.

In the measurement/inspection apparatus 5000 of the present example illustrated in FIG. 5, the detector 107 detects secondary electrons (SE) having relatively low energy, generated from the sample 110 irradiated with the converged electron beam A2, and the detector 107a detects reflected electrons (BSE) having relatively high energy, generated from the sample 110.

In Example 1, a detection signal from the detector 107 is amplified in the amplifier 30 so as to be sent to the secondary electron detection signal processing unit 50, and is then sent to the analog method signal processing portion 52 and the pulse count method signal processing portion 53 so as to be subject to signal processing. In contrast, in the present example, a signal output from the detector 107 which detects secondary electrons (SE) A4 having relatively low energy is amplified in the amplifier 30 so as to be input to an analog method signal processing portion 351 of a signal processing unit 350, and then signal processing is performed according to an analog method so that an image is formed. A signal output from the detector 107a which detects reflected electrons (BSE) having relatively high energy is amplified in an amplifier 30a so as to be input to a pulse count method signal processing portion 352 of the signal processing unit 350, and then signal processing is performed according to a pulse count method so that an image of a pattern edge is formed.

The image formed in the analog method signal processing portion 351 and the image formed in the pulse count method signal processing portion 352 are input to an image combining portion 353, and a combined image is formed in the same manner as described in Example 1 with reference to FIG. 3.

As described in Example 1, an image (frame addition image) which is formed in the analog method signal processing portion 351 and in which signals of a plurality of frames are added together may be hardly obtained as a clear image in which an edge part of a fine pattern can be specified in a case where an imaging target pattern is fine. It is considerably hard to obtain an accurate dimension of the pattern from such an image, and, even if the dimension is obtained, a large error component is included therein. On the other hand, images of an edge of a pattern are obtained as images formed in the pulse count method signal processing portion 352 as described in Example 1.

An image combining portion 353 combines, as described with reference to FIG. 3 in Example 1, a measurement image generated by adding a plurality of frame images output from the analog method signal processing portion 351 with the images of the edge of the pattern formed in the pulse count method signal processing portion 352 in the pixel unit or for each fine region with several pixel unit. Consequently, it is possible to obtain an image which is clearer in the edge part of the pattern than the single measurement image generated by adding a plurality of frame images in the analog method signal processing portion 351, and in which background noise is removed and image quality is improved.

An image combined in the image combining portion 353 is sent to the image processing unit 205 in the same manner as in the case of Example 1. In a case where the measurement/inspection apparatus 5000 is a CD-SEM (length measurement SEM), the image processing unit 205 receiving the combined image generates a measurement image on the basis of the received combined image, computes a pattern dimension value in the combined image, and outputs a result thereof from the GUI unit 215. In a case where the measurement/inspection apparatus 5000 is an inspection apparatus, the image processing unit 205 receiving the combined image generates an inspection image on the basis of the received combined image, compares a reference image with the image so as to detect a defect of the pattern in the image, and outputs a result thereof from the GUI unit 215.

As mentioned above, according to the present example, the charged particle beam measurement/inspection apparatus which generates an image by using both of an analog integration method of receiving an analog signal and forming an integration image and a pulse count method can perform high sensitivity detection of a weak secondary electron due to a high resolution and fast scanning and can make luminance grayscales of a detection image appropriate, and thus contributes to improvement of a resolution and achievement of high throughput.

As mentioned above, the invention made by the present inventor has been described in detail on the basis of the Examples, but the present invention is not limited to the above-described Examples, and may be variously modified within the scope without departing from the spirit thereof.

REFERENCE SIGNS LIST

30 AND 30a PREAMPLIFIER CIRCUIT
50 AND 60 SECONDARY ELECTRON DETECTION SIGNAL PROCESSING UNIT
51 SIGNAL DISTRIBUTOR
52, 351, AND 610 ANALOG METHOD SIGNAL PROCESSING PORTION
53, 352, AND 620 PULSE COUNT METHOD SIGNAL PROCESSING PORTION
54, 353, AND 630 IMAGE COMBINING PORTION
100 AND 500 COLUMN
107 AND 107a DETECTOR
200 COMPUTER (SIGNAL PROCESSING SYSTEM)
205 IMAGE PROCESSING UNIT
210 CONTROL UNIT
1000 AND 5000 MEASUREMENT/INSPECTION APPARATUS

The invention claimed is:

1. A charged particle beam device comprising:
a charged particle optical system that irradiates a surface of a sample with a converged charged particle beam so as to perform scanning;
a detection unit that detects secondary charged particles generated from the sample irradiated with the charged particle beam by the charged particle optical system;
an image forming unit that receives a detection signal from the detection unit and forms an image of the sample;
an image processing unit that processes the image formed in the image forming unit; and
a display unit that displays a result processed by the image processing unit,
wherein the image forming unit includes
an analog signal processing portion that processes an analog signal component of the detection signal in the detection unit,
a pulse count method signal processing portion that processes a pulse signal component of the detection signal in the detection unit, and
an image combination processing portion that combines a signal from the analog signal processing portion with a signal from the pulse count method signal processing portion.

2. The charged particle beam device according to claim 1, wherein the analog signal processing portion receives a detection signal output from the detection unit when the charged particle optical system irradiates and scans the same region on the sample surface with the charged particle beam a plurality of times, so as to form a plurality of frame images, forms an addition image by adding the plurality of formed frame images together, and outputs the formed addition image to the image combining portion.

3. The charged particle beam device according to claim 1, wherein the pulse count method signal processing portion receives a detection signal output from the detection unit when the charged particle optical system irradiates and scans the same region on the sample surface with the charged particle beam a plurality of times, so as to detect pulses exceeding a preset threshold value, stores position information of the detected pulses over a plurality of frames, generates an image by adding the position information of the detected pulses corresponding to the plurality of frames, and outputs the generated image to the image combining portion.

4. The charged particle beam device according to claim 1, wherein the analog signal processing portion extracts a low frequency signal component from a detection signal in the detection unit through a low-pass filter, and processes the extracted low frequency signal component so as to form an image.

5. The charged particle beam device according to claim 1, wherein the pulse count method signal processing portion extracts a high frequency signal component from a detection signal in the detection unit through a high-pass filter, and processes the extracted high frequency signal component so as to form an image.

6. The charged particle beam device according to claim 1, wherein the detection unit includes
a first detector that detects a secondary charged particle having relatively low energy generated from the sample irradiated with the charged particle beam by the charged particle optical system, and
a second detector that detects a secondary charged particle having relatively high energy generated from the sample irradiated with the charged particle beam by the charged particle optical system, and
wherein the analog signal processing portion processes a detection signal output from the first detector, and the pulse count method signal processing portion processes a detection signal output from the second detector.

7. An image forming method using a charged particle beam device, the method comprising:
causing a charged particle optical system to irradiate a surface of a sample with a converged charged particle beam so as to perform scanning;
causing a detection unit to detect secondary charged particles generated from the sample irradiated with the charged particle beam by the charged particle optical system;
causing an image forming unit to receive a detection signal from the detection unit having detected the secondary charged particles and to form an image of the sample;
causing an image processing unit to process the image formed in the image forming unit; and
causing a display unit to display a result processed by the image processing unit,
wherein forming an image of the sample in the image forming unit includes
causing an analog signal processing portion to process an analog signal component of the detection signal in the detection unit so as to form an image,
causing a pulse count method signal processing portion to process a pulse signal component of the detection signal in the detection unit so as to form an image, and
causing an image combination processing portion to combine the image formed in the analog signal processing portion with the image formed in the pulse count method signal processing portion.

8. The image forming method using a charged particle beam device according to claim 7,
wherein forming an image in the analog signal processing portion includes causing the analog signal processing portion to receive a detection signal output from the detection unit when the charged particle optical system irradiates and scans the same region on the sample surface with the charged particle beam a plurality of times, so as to form a plurality of frame images, to form an addition image by adding the plurality of formed frame images together, and to output the formed addition image to the image combining portion.

9. The image forming method using a charged particle beam device according to claim 7,
wherein forming an image in the pulse count method signal processing portion includes causing the pulse count method signal processing portion to receive detection signals corresponding to a plurality of frames output from the detection unit when the charged particle optical system irradiates and scans the same region on the sample surface with the charged particle beam a plurality of times, so as to detect pulses exceeding a preset threshold value, to store position information of the detected pulses over a plurality of frames, to generate an image by adding the position information of the detected pulses corresponding to the plurality of frames, and to output the generated image to the image combining portion.

10. The image forming method using a charged particle beam device according to claim 7,
wherein forming an image in the analog signal processing portion includes causing the analog signal processing portion to extract a low frequency signal component from a detection signal in the detection unit through a low-pass filter, and to process the extracted low frequency signal component so as to form an image.

11. The image forming method using a charged particle beam device according to claim 7,
wherein forming an image in the pulse count method signal processing portion includes causing the pulse count method signal processing portion to extract a high frequency signal component from a detection signal in the detection unit through a high-pass filter, and to process the extracted high frequency signal component so as to form an image.

12. The image forming method using a charged particle beam device according to claim 7,
wherein the detection unit detects a secondary charged particle having relatively low energy generated from the sample irradiated with the charged particle beam by the charged particle optical system, by using a first detector, and detects a secondary charged particle having relatively high energy generated from the sample irradiated with the charged particle beam by the charged particle optical system, by using a second detector, and
wherein the analog signal processing portion processes a detection signal output from the first detector so as to form an image, and the pulse count method signal processing portion processes a detection signal output from the second detector so as to form an image.

* * * * *